(12) United States Patent
Jones et al.

(10) Patent No.: US 6,198,220 B1
(45) Date of Patent: *Mar. 6, 2001

(54) SEALING STRUCTURE FOR ORGANIC LIGHT EMITTING DEVICES

(75) Inventors: Gary W. Jones; Webster E. Howard, both of Lagrangeville; Steven M. Zimmerman, Pleasant Valley, all of NY (US)

(73) Assignee: eMagin Corporation, Hopewell Junction, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/074,406

(22) Filed: May 8, 1998

Related U.S. Application Data

(60) Provisional application No. 60/052,344, filed on Jul. 11, 1997.

(51) Int. Cl.[7] .............................. B05D 1/36; H01L 33/00; H01J 1/62
(52) U.S. Cl. .......................... 313/512; 313/506; 427/66; 427/77; 427/123; 427/404; 427/383.3; 428/621; 428/630; 428/631; 428/917; 345/71; 345/82; 257/88; 257/100
(58) Field of Search .............................. 427/77, 78, 123, 427/66, 255.7, 376.6, 404, 383.3; 428/917, 621, 630, 631; 345/82, 71; 257/88, 100, 710; 313/509, 512, 506

(56) References Cited

U.S. PATENT DOCUMENTS

| | | |
|---|---|---|
| 4,206,382 | 6/1980 | DuBois . |
| 5,142,343 | 8/1992 | Hosokawa et al. . |
| 5,408,245 | 4/1995 | Kakizaki . |
| 5,427,858 | 6/1995 | Nakamura et al. . |
| 5,482,896 | 1/1996 | Tang . |
| 5,499,122 | 3/1996 | Yano . |
| 5,505,985 | 4/1996 | Nakamura et al. . |
| 5,530,269 | 6/1996 | Tang . |
| 5,545,899 | 8/1996 | Tran et al. . |
| 5,686,360 | * 11/1997 | Harvey, III et al. ................. 437/211 |
| 5,693,956 | * 12/1997 | Shi et al. ............................. 257/40 |
| 5,721,160 | * 2/1998 | Forrest et al. ....................... 438/28 |
| 5,734,225 | * 3/1998 | Biebuyck et al. .................. 313/512 |
| 5,736,754 | * 4/1998 | Shi et al. ............................. 257/89 |
| 5,771,562 | * 6/1998 | Harvey, III et al. ................. 29/592.1 |

* cited by examiner

*Primary Examiner*—Shrive Beck
*Assistant Examiner*—Michael Barr
(74) *Attorney, Agent, or Firm*—Collier Shannon Scott, PLLC

(57) ABSTRACT

A sealing structure for an organic light emitting device display. The sealing structure comprises a metal film overlying a dielectric film. The sealing structure has low moisture and oxygen permeability. At least one of the metal layers may react with moisture or oxygen to seal off pin holes. A net low stress sealing structure may be formed by combining tensile and compressive films. The sealing structure may be etched to create openings for connection to outside circuitry. The innovative sealing structure minimizes moisture leakage and vertical shorts between diode cathode and anode.

15 Claims, 2 Drawing Sheets

SEALING STRUCTURE FOR ORGANIC LIGHT EMITTING DEVICES

CROSS REFERENCE TO RELATED APPLICATIONS

This application relates to and claims priority on U.S. Provisional Application Ser. No. 60/052,344, entitled "SEALING STRUCTURE FOR ORGANIC LIGHT-EMITTING DISPLAYS," filed on Jul. 11, 1997.

FIELD OF THE INVENTION

The present invention relates to displays comprising organic light emitting devices ("OLEDs"). In particular, the invention relates to methods and structures for sealing OLEDs.

BACKGROUND OF THE INVENTION

Electroluminescent devices, which may be further classified as either organic or inorganic, are well known in graphic display and imaging art. The benefits of organic electroluminescent devices, such as organic light emitting devices, include: high visibility due to self-emission; superior impact resistance; and ease of handling of the solid state devices. OLEDs, such as organic light emitting diodes, may have practical application for television and graphic displays, as well as in digital printing applications.

An OLED is typically a thin film structure formed on a substrate such as soda-lime glass. A light emitting layer of a luminescent organic solid, as well as adjacent semiconductor layers, are sandwiched between a cathode and an anode. The semiconductor layers may be either hole-injecting or electron-injecting layers. The light emitting layer may be selected from any of a multitude of fluorescent organic solids. The light emitting layer may consist of multiple sublayers.

When a potential difference is applied across the device, negatively charged electrons move from the cathode to the electron-injecting layer and finally into the layer(s) of organic material. At the same time, positive charges, typically referred to as holes, move from the anode to the hole-injection layer and finally into the same light emitting organic layer. When the positive and negative charges meet in the organic material layer(s), they recombine and produce photons. The wave length—and consequently the color—of the photons depends on the electronic properties of the organic material in which the photons are generated.

In a typical matrix-addressed OLED display, numerous OLEDs are formed on a single substrate and arranged in groups in a grid pattern. Several OLED groups forming a column of the grid may share a common cathode, or cathode line. Several OLED groups forming a row of the grid may share a common anode, or anode line. The individual OLEDs in a given group emit light when their cathode line and anode line are activated at the same time.

OLEDs have a number of beneficial characteristics. These characteristics include a low activation voltage (about 2 volts), fast response when formed with a thin light emitting layer, and high brightness in proportion to the injected electric current. Depending on the composition of the organic material making up the light emitting layer, many different colors of light may be produced, ranging from visible blue, to green, yellow and red.

OLEDs are susceptible to damage resulting from exposure to the atmosphere. The fluorescent organic material in the light emitting layer can be reactive. Exposure to moisture and oxygen may cause a reduction in the useful life of the light emitting device. The organic material is susceptible to reacting with constituents of the atmosphere such as water and oxygen. Additionally, the materials that typically comprise the cathode and anode may react with oxygen and may be negatively affected by oxidation.

One disadvantage of oxygen and moisture penetration into the interior of the OLED is the potential to form metal oxide impurities at the metal-organic material interface. In a matrix addressed OLED, these metal oxide impurities may cause separation of the cathode or anode from the organic material. Oxidation sensitive cathode materials such as Mg—Ag or Al—Li are especially susceptible. The result may be dark, non-emitting spots at the areas of separation due to a lack of current flow.

Edge shorting between the cathode and anode layers is a further problem currently affecting most conventional OLED displays. Edge shorting reduces the illumination potential of the display devices.

For the reasons set forth above, exposing a conventional OLED to the atmosphere, shortens its life. To obtain a practical, useable OLED, it is necessary to protect or seal the device, so that water, oxygen, etc., do not infiltrate the light emitting layer or oxidize the electrodes.

Methods commonly employed for protecting or sealing inorganic electroluminescent devices are typically not effective for sealing OLEDs. For example, when the "silicon oil method" sometimes used for sealing inorganic electroluminescent devices is used on an OLED, the silicon oil infiltrates the light emitting layer, the electrodes, and any hole-injecting or electron-injecting layers. The oil alters the properties of the organic light emitting layer, reducing or eliminating its light emission capabilities. Similarly, resin coatings that have been used to protect inorganic electroluminescent devices are not suited for OLEDs. The solvent used in the resin coating solution tends to infiltrate the light emitting layer, degrading the light emission properties of the device.

U.S. Pat. No. 5,505,985 issued to Nakamura, et al., ("Nakamura") teaches a process for depositing a film comprising an electrically insulating polymer as a protective layer on an outer surface of an organic electroluminescent device. Nakamura asserts that the polymers disclosed protect the device and have excellent electrical resistivity, breakdown strength and moisture resistance, while at the same time are transparent to emitted light. Nakamura also teaches that, when deposited by a physical vapor deposition (PVD) method, the protective layer formed by the polymer compound is pin-hole free. The sealing method taught by Nakamura, however, yields a moisture diffusivity too high to be useful for reliable OLEDs. Moisture levels as low as 1 ppm may damage an OLED.

Others have tried evaporated metal films to seal an OLED. However, to avoid pinholes, these films must be relatively thick, resulting in poor light transmission.

Accordingly, there is a need for a method for sealing an OLED without adding to its complexity and expense. There is also a need for a method and apparatus for sealing an OLED which can be easily integrated into existing fabrication methods. The present invention meets this need, and provides other benefits as well.

OBJECTS OF THE INVENTION

It is therefore an object of the present invention to provide a method and apparatus for hermetically sealing an OLED.

It is a further object of the present invention to provide a method and apparatus for sealing an OLED which minimizes moisture leakage into the device's structure.

It is still another object of the present invention to provide a method and apparatus for sealing an OLED which reacts with moisture and/or oxygen to absorb these gases.

It is yet another object of the present invention to provide a method and apparatus for sealing an OLED which has low moisture and oxygen permeability.

It is still another object of the present invention to provide a method and apparatus for sealing an OLED which reacts with moisture or oxygen to seal off pin holes.

It is another object of the present invention to provide a method and apparatus for sealing an OLED with a low stress coating.

It is yet another object of the present invention to provide a method and apparatus for sealing an OLED which permits openings to be created for connections to outside circuitry.

It is another object of the present invention to reduce the incidence of vertical shorts between cathode and anode grid lines in a matrix addressed OLED display.

It is another object of the present invention to minimize shorts and leakage between the cathode and anode of an OLED.

Additional objects and advantages of the invention are set forth, in part, in the description which follows, and, in part, will be apparent to one of ordinary skill in the art from the description and/or from the practice of the invention.

SUMMARY OF THE INVENTION

In response to the foregoing challenges, Applicants have developed an innovative and economical display device comprising: an organic light emitting device; and a sealing structure overlying the organic light emitting device, wherein the sealing structure comprises a dielectric film and a metal film. The metal film may overlie the dielectric film. Alternatively, the sealing structure may comprise a multilayer stack of dielectric and metal film. The multilayer stack may comprise a first dielectric film overlying the organic light emitting device, followed by alternating layers of metal film and dielectric film. The sealing structure may comprise a material with low oxygen permeability and/or low moisture permeability. The sealing structure may further comprise a material which reacts with moisture and/or oxygen to seal pin holes. The sealing structure may also have reduced internal stresses. The sealing structure may further comprise an opening for connecting the organic light emitting device to electrical circuitry.

The present invention also includes a display device comprising: a matrix comprising a plurality of organic light emitting devices; a sealing structure overlying the organic light emitting devices; a plurality of conductors underlying the sealing structure, wherein each conductor functions as either an anode or cathode for more than one of said organic light emitting devices; wherein the sealing structure includes openings for permitting direct contact between circuitry external to the matrix and the conductors underlying the sealing structure.

The present invention further includes a method for sealing an organic light emitting device comprising the steps of: forming a dielectric film layer overlying said organic light emitting device; and forming a metal film layer over said dielectric film. The method may comprise the further step of covering the organic light emitting device and film layers with a layer of photoresist material. Following the step of forming the metal film, the method may include the step of presealing pin holes in the metal film layer. The presealing step may comprise baking the display device in purified air or in an N—$O_2$ atmosphere.

It is to be understood that both the foregoing general description and the following detailed description are exemplary and explanatory only, and are not restrictive of the invention as claimed. The accompanying drawings, which are incorporated herein by reference and which constitute a part of this specification, illustrate certain embodiments of the invention, and together with the detailed description serve to explain the principles of the present invention.

DETAILED DESCRIPTION OF THE INVENTION

Figure 1:
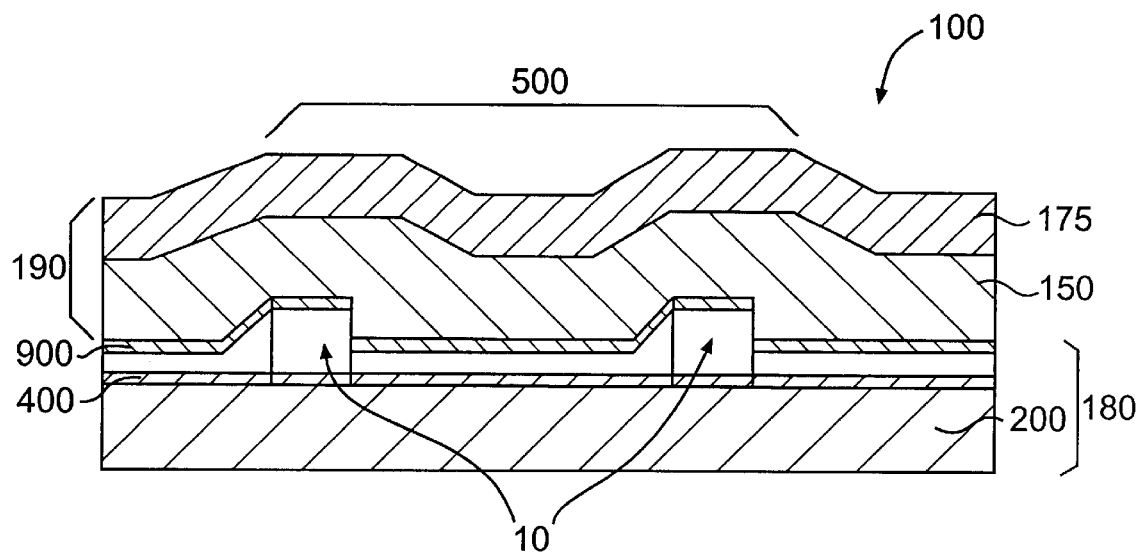
FIG. 1 is a cross-sectional side view in elevation along line A—A of FIG. 2 of an embodiment of an OLED display of the present invention.

Reference will now be made in detail to the present invention, an example of which is illustrated in the accompanying drawings. An embodiment of the present invention is shown in FIG. 1 as device 100, a sealed OLED display.

Device 100 is a layered structure of conductive, insulating, and semiconductive materials constructed in a series of process steps. A preferred method for making the sealed display device 100 is fabricating an organic light emitting diode (OLED) display 180 comprising at least one OLED 10 of the type depicted in FIG. 2. The OLED 10 may be arranged in any of a number of known matrix-addressed configurations.

Figure 2:
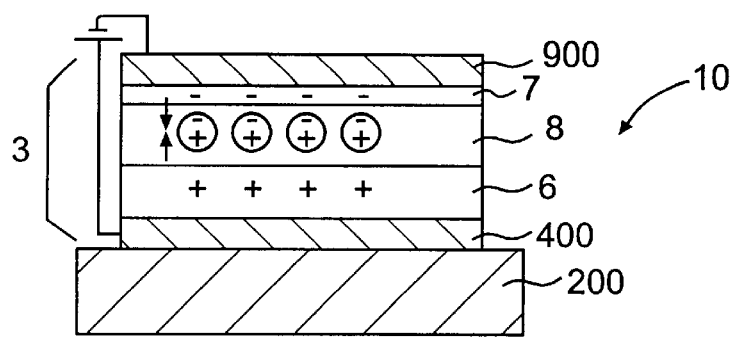
FIG. 2 is a cross-sectional side view of an OLED showing the movement of holes and electrons.

FIG. 2 depicts a typical OLED of the type known in the prior art. With reference to FIG. 2, a typical OLED 10 has a laminate structure 3 formed on a substrate 200. A light emitting layer 8, made of a luminescent organic solid, as well as an adjacent semiconductor layer 6, are sandwiched between a cathode 900 and an anode 400. Semiconductor layer 6 may be, for example, a hole-injecting layer. When semiconductor layer 6 is a hole-injecting layer, electron-injecting layer 7 may be provided in addition to, or in lieu of, hole-injecting semiconductor layer 6, depending on the specific materials employed. Light emitting layer 8 may be selected from any of a multitude of luminescent organic solids, and may consist of multiple sub-layers. Substrate 200 is often soda-lime glass.

As depicted in FIG. 2, when a potential difference is applied across the cathode 900 and anode 400, electrons from electron-injecting layer 7, and holes from hole-injecting semiconductor layer 6 are injected into light emitting layer 8. The injected electrons and holes recombine, causing light to be emitted from the organic material 8.

Although layers 400 and 900 are depicted as the anode and cathode respectively, it is within the scope of the present invention that the function of the layers be switched so that the layer 400 is the cathode and the layer 900 is the anode.

Preferably, the laminate structure is formed on a substrate 200 using known fabrication techniques, such as evaporative deposition, chemical vapor deposition (CVD), etching, etc. The size, form, material, etc., of the substrate 200 and of each layer of the laminated structure may be selected depending on the intended use of the device, such as a surface light source, a matrix photographic display, a matrix for a television image display device, etc. In addition, a variety of well known hole-injecting and electron-injecting layers are available depending on the desired charge injection, transport and barrier properties. The material for these layers may be selected from a number of acceptable organic or inorganic materials. Likewise, the organic light emissive layer 8 may be selected from any of a number of different materials depending on the light emission characteristics desired.

Dielectric film 150 and metal film 175 together comprise sealing structure 190. In the preferred embodiment of the present invention, a film 150 of low pin hole density dielectric material is deposited on the outer surface of the OLED display 180 structure. The dielectric film 150 may be formed to overlie the cathode 900. Dielectric film 150 preferably is formed on the entire exposed outer surface of OLED display 180 opposite substrate 200. Preferably, dielectric film 150 is formed by the plasma enhanced chemical vapor deposition (PECVD) method. Alternatively, dielectric film 150 may be formed by CVD, evaporation, or sputtering. Shadow masking may be employed to prevent deposition of material in areas where external electrical connections to the OLED may be required.

Dielectric film 150 preferably comprises SiC deposited by PECVD from trimethylsilane to a thickness of 500 nm. Alternatively, dielectric film 150 may comprise diamond-like carbon (DLC), SiO, $SiO_2$, $Si_3N_4$, and $SiN_xO_y$ (silicon oxynitride). The preferred deposition method, as well as the desired film thickness, depends on the dielectric material utilized. For example, for SiC, the PECVD deposition described above produces a dielectric film 150 with a suitable combination of dielectric strength, film adhesion, pin hole density and impermeability. Additionally, dielectric film 150 may comprise multiple layers of various dielectric materials, e.g., $SiO_2$ and SiC; DLC and SiC; or $Si_3Nu$ and $SO_2$, which may be combined to form a single film with a desired net dielectric constant and other characteristics. The aforementioned materials are not exclusive; it is contemplated that other dielectric materials may be used without departing from the scope of the invention.

Metal film 175 overlies the dielectric film 150. Preferably, metal film 175 is formed through sputter deposition. The deposition process employed depends upon the metal deposited, as well as the desired film thickness and characteristics. A combination of PECVD and electron beam or sputter gun deposition exhibits the lowest pin hole density. Metal film 175 may also be formed by evaporation, CVD or other appropriate process. As with dielectric film 150, shadow masks or lift off patterning may be used to prevent deposition of material in areas where external electrical connections will be made or to keep conductor pad areas open.

Metal film 175 may comprise anyone of the following materials: pure Al, 5–10 weight-% Ti-doped Al, Al and Cu, In, Mg, Ca, Ti; Ti/TiN; Sc; $Sc_2O_3$; or Ta. It is also within the scope of the present invention to construct film 175 from a combination of two or more of the foregoing. In some embodiments a thin (e.g., (10 nm)) Cr layer may be included within 175 as an underlayer for certain materials such as Ca in order to enhance adhesion. The thickness of metal film 175 is generally a function of the particular metal, or combination of metals employed. Other metal materials may also be used without departing from the scope of the invention. In other embodiments, metal film 175 may comprise one or more layers of various metals, depending on the specific characteristics desired.

Metal film 175 is preferably formed of a material, or materials, which will self-seal pin holes or other defects in the film by volume expansion as metal oxide forms in the presence of moisture and/or oxygen. Metal film 175 is constructed to reduce the film's susceptibility to cracking under stress. For example, 10 weight-% Ti-doped Al may be deposited via sputtering to a film thickness of 500 nm. This material and film thickness generally provides an acceptable combination of stress and moisture resistance while maintaining a relatively thin film. RF or DC bias sputtering may also be employed in order to minimize pinholes.

Any pin holes in metal film 175 may be presealed in a controlled environment, rather than waiting for the self-sealing characteristics of the metal film to work during operational use of the OLED display. To achieve this presealing, the device is preferably baked in purified air, or alternatively, a dry nitrogen-oxygen atmosphere, since moisture is the greatest hazard. The purified air may be obtained through the use of filters commonly known to those of ordinary skill in the art.

The choice of materials and numbers of layers for films 150 and 175 depends on certain characteristics which may be desired for sealing structure 190. For example, at least one of the dielectric layers comprising dielectric film 150 and/or one of the metal layers comprising metal film 175 preferably has low moisture and oxygen permeability. Additionally, at least one of the metal layers comprising metal film 175 preferably reacts with moisture or oxygen to absorb the gases, or, alternatively, to seal off pin holes in the layer. A variety of reactive metals, such as Al, and the other metals previously noted herein, exhibit these beneficial properties.

The materials used for the dielectric film 150 and metal film 175 may be constructed under varying amounts of tensile and compressive stress in order to achieve a low net internal stress throughout sealing structure 190. Material deposition techniques which produce low film stresses may be employed in order to minimize stresses on the sealing structure 190. For example, the dielectric film layer 150 may be constructed by depositing silicon nitride, silicon dioxide, or silicon oxynidries by PEVCD methods adjusted to minimize internal stresses. Layers formed of Al typically possess internal compressive stresses which inhibit crack formation and growth.

Sealing structure 190 may also comprise alternating layers of metal and dielectric materials. The first dielectric layer generally covers the OLED display 180 followed by the first metal layer. A sealing structure 190 comprising alternating layers of SiO and Al provides the advantages described above. However, other combinations of metal and dielectric materials are within the scope of the invention.

One or more openings may be formed in the sealing structure 190 to provide access from the OLED display matrix to outside circuitry. The outside circuitry typically connects to the matrix conductors at perimeter pad areas 155, shown in FIG. 3. If shadow masking or lift off patterning has not been employed, the perimeter pad areas 155, for connecting the OLED display to external circuitry, may be patterned using conventional photolithography techniques. In order to provide access to the perimeter pad area 155, an opening 160 may be formed in the metal film 175. An etch solution comprising 60 weight-% phosphoric acid, 5 weight-% nitric acid and 35 weight-% water may be employed to form opening 160 in metal film 175. An opening 165 in dielectric film 150 may then be formed using reactive ion etching (RIE) process using $CF_4$ and $O_2$. Alternative etching solutions may be employed depending on the metal and dielectric material chosen.

Figure 3:
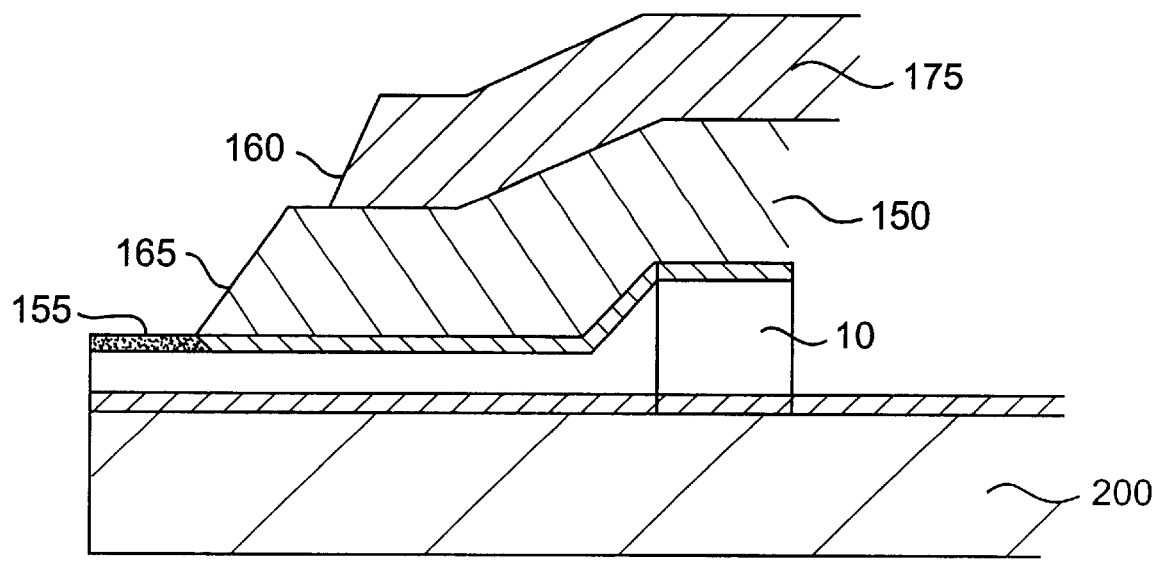
FIG. 3 is a cross-sectional side view of a portion of an OLED display of the present invention showing openings in the sealing structure for connection to outside circuitry.

Following the etching of the metal film 175 and dielectric film 150, a portion of the metal film 175 may remain undesirably close to pad area 155 and, thereby, pose a risk of accidental shorting between metal film 175 and the pad area 155. If this occurs, additional etching employing a solution as described above, may be performed to cause the metal to recede from opening 165 and pad area 155, as shown in FIG. 3, thus reducing the risk of accidental shorting.

After etching is completed, any remaining photoresist may be removed, preferably using warm N-methyl pyrrolidone (NMP), with an alcohol rinse. Other known photoresist removal techniques may also be used.

The novel sealing structure of the present invention thus employs relatively inexpensive, easily performed, and well-understood processes. The layered sealing structure 190 of the invention has a net low moisture and oxygen permeability. Pin holes in the outer metal film 175 which might otherwise provide a path for moisture or oxygen into the interior layers of the device are closed by the self-sealing nature of the metal. These characteristics, as well as the combined low net film stress of the sealing layers, work together to minimize degradation of the organic light emitting material, minimize shorts and leakage between the cathode 900 and anode 400 of an OLED, and reduce vertical shorting of the cathode and anode grid lines in a matrix addressed OLED display. The novel dielectric and metal sealing structure of the invention improves OLED display yield and enhances the economic viability of these displays.

It will be apparent to those skilled in the art that various modifications and variations can be made in the construction, configuration, and/or operation of the present invention without departing from the scope or spirit of the invention. For example, in the embodiments mentioned above, various changes may be made to the materials used for, as well as to the processes used to deposit, the dielectric and metal films. Variations in the construction of the OLED itself, including numbers and types of layers, as well as variations in the numbers and groupings of individual OLEDs in the OLED display, may also be made without departing from the scope and spirit of the invention. Thus, it is intended that the present invention cover all modifications and variations of the present invention, provided they come within the scope of the appended claims and their equivalents.

What is claimed is:

1. A display device comprising:
    an organic light emitting device, wherein said organic light emitting device includes a first conductor layer formed on a substrate, a plurality of organic layers formed on said first conductor layer, and a second conductor layer formed on said plurality of organic layers, said second conductor layer having an exposed surface; and
    a sealing structure formed on said exposed surface of said second conductor layer for sealing said organic light emitting device, wherein said sealing structure comprises a dielectric film formed directly on said exposed surface of said second conductor layer and a metal film formed directly on said dielectric film, wherein said dielectric film has a dielectric film exposed surface and said metal film is formed over and in contact with said entire dielectric film exposed surface, wherein said dielectric film includes at least one layer formed from a material selected from the group consisting of SiC, DLC, SiO, $SiO_2$, $Si_3N_4$ and $SiN_xO_y$.

2. The display according to claim 1, wherein said metal film of said sealing structure comprises a material which reacts with moisture to seal pin holes in said metal film.

3. The display according to claim 1, wherein said metal film of said sealing structure comprises a material which reacts with oxygen to seal pin holes in said metal film.

4. The display according to claim 1, further comprising an opening in said sealing structure for connecting said organic light emitting device to electrical circuitry.

5. The display according to claim 1, wherein said sealing structure comprises a multilayer stack of dielectric film and metal film layers.

6. The display according to claim 5, wherein said multilayer stack comprises a first dielectric film overlying said organic light emitting device, followed by alternating layers of metal film and dielectric film.

7. A display device comprising:
    a matrix comprising a plurality of organic light emitting devices, wherein each of said organic light emitting devices includes a first conductor layer formed on a substrate, a plurality of organic layers formed on said first conductor layer, and a second conductor layer formed on said plurality of organic layers, said second conductor layer having an exposed surface;
    a sealing structure formed on said exposed surface of said second conductor layer for sealing of said plurality of organic light emitting devices, wherein said sealing structure comprises a dielectric film formed directly on said exposed surface of said second conductor layer and a metal film formed directly on said dielectric film, wherein said dielectric film has a dielectric film exposed surface and said metal film is formed over and in contact with said entire dielectric film exposed surface, wherein said dielectric film includes at least one layer formed from a material selected from the group consisting of SiC, DLC, SiO, $SiO_2$, $Si_3N_4$ and $SiN_xO_y$; and
    means for permitting direct contact between circuitry external to the matrix and said first and second conductors underlying the sealing structure.

8. The display according to claim 7, wherein said sealing structure comprises a multilayer stack of dielectric film and metal film layers.

9. The display according to claim 8, wherein said multilayer stack comprises a first dielectric film overlying said organic light emitting device, followed by alternating layers of metal film and dielectric film.

10. The display according to claim 7, wherein said means for permitting direct contact comprise openings in said sealing structure.

11. A method for sealing an organic light emitting device having a top conductor layer having an exposed surface comprising the steps of:
    forming a dielectric film layer directly on the exposed surface of said top conductor layer of said organic light emitting device, wherein said dielectric film has a dielectric film exposed surface, wherein said dielectric film includes at least one layer formed from a material selected from the group consisting of SiC, DLC, SiO, $SiO_2$, $Si_3N_4$ and $SiN_xO_y$; and
    forming a metal film layer directly on said dielectric film such that said metal film is formed over and in contact with said entire dielectric film exposed surface.

12. The method according to claim 11, comprising the further step of covering the organic light emitting device and film layers with a layer of photoresist material.

13. The method according to claim 11, further comprising the step of:
   presealing pin holes in the metal film layer, following the step of forming the metal film layer over the dielectric film.

14. The method of claim 13, wherein said presealing step comprises baking said sealed organic light emitting device in purified air.

15. The method of claim 13, wherein said presealing step comprises baking said sealed organic light emitting device in an N—$O_2$ atmosphere.

* * * * *